(12) United States Patent
Werner et al.

(10) Patent No.: US 9,983,232 B2
(45) Date of Patent: May 29, 2018

(54) PROBER FOR TESTING DEVICES IN A REPEAT STRUCTURE ON A SUBSTRATE

(71) Applicant: Cascade Microtech, Inc., Beaverton, OR (US)

(72) Inventors: Frank-Michael Werner, Dresden (DE); Matthias Zieger, Riesa (DE); Sebastian Giessmann, Wildenhain (DE)

(73) Assignee: Cascade Microtech, Inc., Beaverton, OR (US)

( * ) Notice: Subject to any disclaimer, the term of this patent is extended or adjusted under 35 U.S.C. 154(b) by 847 days.

(21) Appl. No.: 14/491,606

(22) Filed: Sep. 19, 2014

(65) Prior Publication Data

US 2015/0008948 A1    Jan. 8, 2015

Related U.S. Application Data

(60) Division of application No. 13/094,604, filed on Apr. 26, 2011, now Pat. No. 8,841,932, which is a continuation of application No. 12/345,980, filed on Dec. 30, 2008, now Pat. No. 7,932,737.

(30) Foreign Application Priority Data

Jan. 10, 2008    (DE) .................... 10 2008 003 754

(51) Int. Cl.
*G01R 1/073* (2006.01)
*G01R 31/28* (2006.01)
*G01R 1/04* (2006.01)

(52) U.S. Cl.
CPC ............... *G01R 1/073* (2013.01); *G01R 1/04* (2013.01); *G01R 31/2891* (2013.01)

(58) Field of Classification Search
CPC ...... G01R 31/2891; G01R 1/04; G01R 1/073; G01L 1/2287; H01L 51/5206
USPC .............. 324/750.01–754.26, 500, 401, 405, 324/755.01, 755.11, 756.03, 758.01, 690, 324/696, 715, 724
See application file for complete search history.

(56) References Cited

U.S. PATENT DOCUMENTS

| | | | |
|---|---|---|---|
| 6,435,045 B1 | 8/2002 | Chen et al. | |
| 6,744,268 B2 | 6/2004 | Hollman | |
| 7,436,171 B2 | 10/2008 | Lou et al. | |
| 7,642,800 B2 | 1/2010 | Ku et al. | |
| 8,841,932 B2 * | 9/2014 | Werner | G01R 31/2891 324/750.16 |

* cited by examiner

*Primary Examiner* — Melissa Koval
*Assistant Examiner* — Trung Nguyen
(74) *Attorney, Agent, or Firm* — Dascenzo Intellectual Property Law, P.C.

(57) ABSTRACT

A prober for testing devices in a repeat structure on a substrate is provided with a probe holder plate, probe holders mounted on the plate, and a test probe associated with each holder. Each test probe is displaceable via a manipulator connected to a probe holder, and a substrate carrier fixedly supports the substrate. Testing of devices, which are situated in a repeat structure on a substrate, in sequence without a substrate movement and avoiding individual manipulation of the test probes in relation to the contact islands on the devices, is achieved in that the probe holders are fastened on a shared probe holder plate and the probe holder plate is moved in relation to the test substrate.

9 Claims, 5 Drawing Sheets

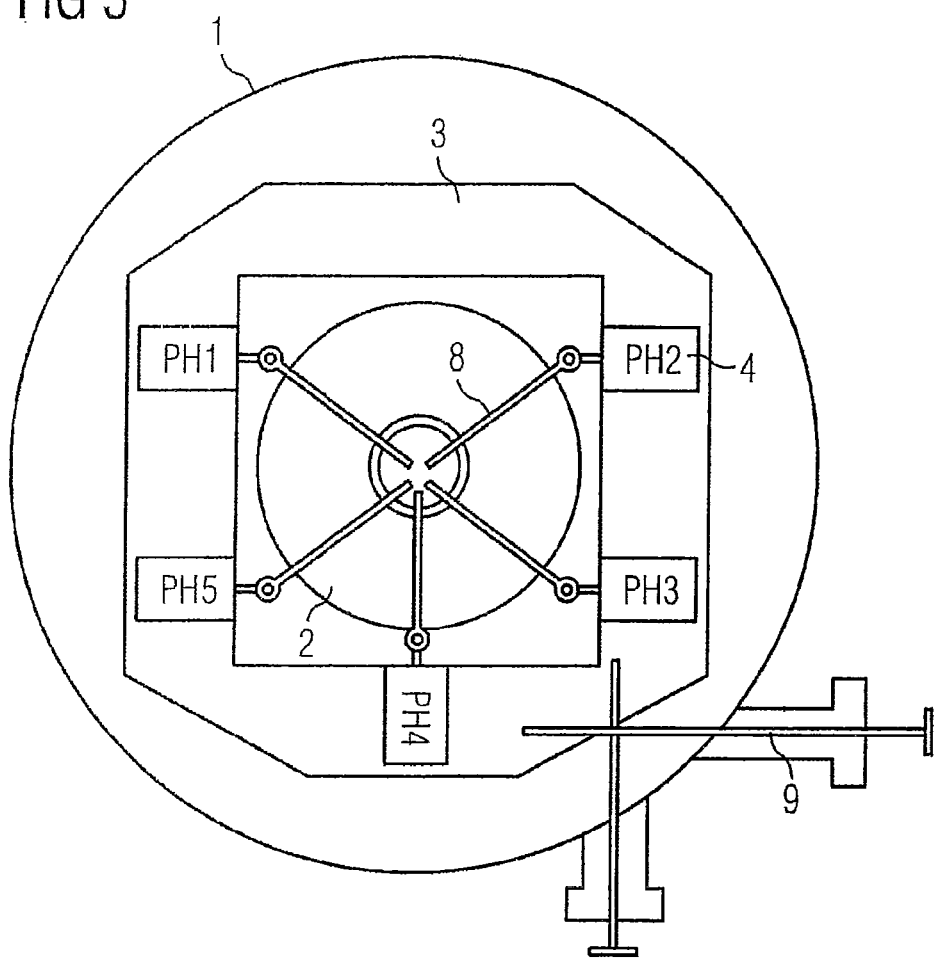

PROBER FOR TESTING DEVICES IN A REPEAT STRUCTURE ON A SUBSTRATE

CROSS REFERENCE TO RELATED APPLICATIONS

The present application is a divisional patent application that claims priority under 35 U.S.C. § 120 to U.S. patent application Ser. No. 13/094,604, entitled "Prober for Testing Devices in a Repeat Structure on a Substrate," which was filed on Apr. 26, 2011, and issued on Sep. 23, 2014 as U.S. Pat. No. 8,841,932. U.S. patent application Ser. No. 13/094,604 claims priority from U.S. patent application Ser. No. 12/345,980, entitled "Prober for Testing Devices in a Repeat Structure on a Substrate," which was filed on Dec. 30, 2008, and issued on Apr. 26, 2011 as U.S. Pat. No. 7,932,737. U.S. patent application Ser. No. 12/345,980 claims priority from German Patent Application Serial No. 10 2008 003 754.0, which was filed on Jan. 10, 2008. The complete disclosures of the above-identified patent applications are hereby incorporated by reference herein.

BACKGROUND ART

The invention relates to a prober for testing devices in a repeat structure on a substrate having a probe holder plate, probe holders, on which a test probe is situated, which are each displaceable via a manipulator connected to a probe holder, and a substrate carrier on which the substrate may be fixed.

The invention also relates to a method for testing devices in a repeat structure on a substrate, in which needle tips of test probes are each positioned using a manipulator on a probe holder in relation to test contacts on the device, one first device is tested, and subsequently the test probes are positioned in relation to test contacts on a second device and the second device is tested.

Probers and methods for testing devices, which have a lower frame, over which a probe holder plate is situated at a distance to accommodate test probes, which contact the devices to be tested, are known. A movement unit is connected to the frame, on which a substrate carrier is situated within the distance spacing between frame and probe holder plate. The probe holder plate is provided with an opening, below which the substrate carrier is implemented as movable.

Probers of this type are used for testing devices, such as semiconductor chips in the wafer composite. The semiconductor wafers are laid on the substrate carrier and clamped fixed on the substrate carrier. The semiconductor wafers thus clamped are tested chip by chip in that contact islands located on the chip are contacted and impinged using measuring signals and the reaction to these measuring signals is measured or established. Test probes are provided for contacting the contact islands. These test probes are pre-mounted before the actual test procedure. The test probes are implemented in the form of test needles having associated needle carriers, which are then clamped fixed at one end in probe holders. The probe holders are then mounted on the probe holder plate in such a way that the needle tips of the test probes engage through the opening in the probe holder plate in the pattern of the contact islands on a semiconductor chip to be tested.

The intended purpose and the construction of the probers also further differ. Thus, for example, so-called vacuum probers are known, in which the testing of the devices occurs in a vacuum environment. Furthermore, subjecting the devices to be tested to specific thermal conditions is known, for example, heating them up during testing. For this purpose, the substrate carrier is equipped with a special cooling unit, which allows low temperatures or ultralow temperatures to be applied.

These known probers are used to test a plurality of different devices, such as semiconductor chips or so-called MEMS (micromechanical devices), such as sensors.

In addition, it is also possible to subject the substrate to a strong magnetic field, magnetic cores, which are powered by a superconductive coil, being situated in proximity to the substrate.

For ultralow temperature probers, which permit testing of devices on the substrate in temperature ranges of 4 K, for example, the substrate carrier is cooled by a liquid gas source, in particular from a helium tank. The relatively low vaporization temperature of helium requires on the one hand that short liquid gas lines be provided, because otherwise the helium heats up so much in long lines that it vaporizes. In addition, it is hardly possible to provide a connection line which is flexible at these temperatures. In particular when supplying the superconductor in magnetization units, fixed piping is necessary between the liquid gas tank and the magnetization unit, but also between the liquid tank and the substrate carrier. This proscribes mobility of the substrate carrier.

If devices are to be tested on a substrate, which are situated thereon in a repeat structure, which particularly all have the same contact island topography, it is necessary to manipulate the test probes from one device to the next again.

For this purpose, in a known prober from Lake Shore Cryotronics Inc., Ohio, having the name VFTT P4 Probe Station, the probe holders, which are provided with manipulators adjustable in the X, Y, and Z directions or are situated on corresponding cross tables, are to be situated outside the vacuum chamber and the test probes are to be inserted through folded bellows into the vacuum chamber and are to be positioned therein on the contact islands of the devices. The manipulation which is required again upon each approach to a new device to be tested is made easier. However, it has been shown that the folded bellows also exerts restoring forces on the test probes, and the temperature differences between chamber interior and chamber exterior strongly strain the test probes. This has the result that the positioning of the needle tips of the test probes on the devices does not have long-term stability.

In contrast, in a known cryoprober of the applicant having the name PMC 150, the probe holders together with their manipulators are situated inside the vacuum chamber. The manipulators are displaced via rotating shafts having universal joints, which are led to the outside, to adjust the test probes. This has the advantage that only three rotary bushings (one for each movement direction) are to be provided to the vacuum chamber wall per manipulator, and otherwise the movement of the test probes occurs in the interior of the vacuum chamber.

Although this prober results in long-term stability of the positioning, it does not overcome the disadvantage that upon testing of a new device, all test probes are to be adjusted to the new device.

BRIEF SUMMARY OF INVENTION

The invention is thus based on the object of testing devices, which are situated having a repeat structure on a substrate, in sequence without a substrate movement and avoiding individual manipulation of the test probes in relation to the contact islands on the devices at the same time.

BRIEF DESCRIPTION OF THE DRAWING FIGURES

The invention is explained in greater detail hereafter on the basis of an exemplary embodiment. In the associated figures of the drawings:

" and FIG. 5 shows a schematic illustration of a prober according to the invention in a vacuum chamber having electrically displaceable manipulators.

DETAILED DESCRIPTION

Figure 1:
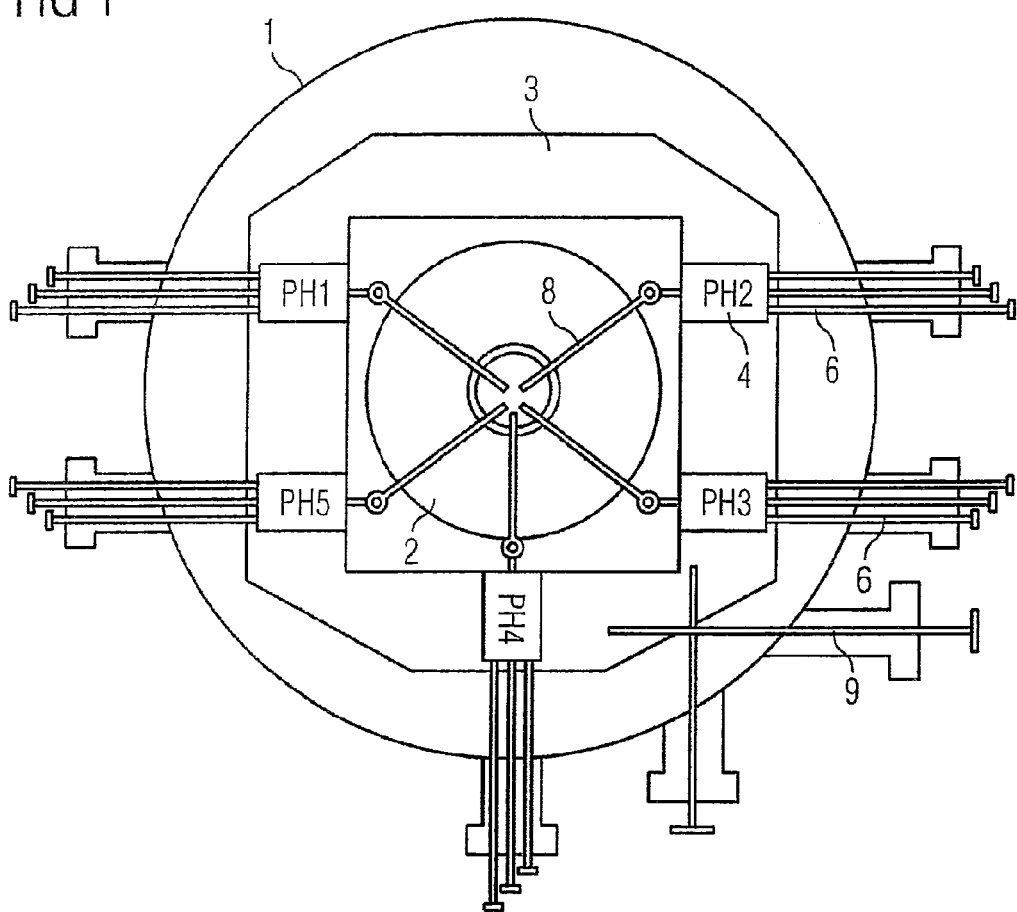
FIG. 1 shows a schematic illustration of a prober according to the invention in a vacuum chamber having mechanical displacement shafts in a middle position of the test probes in relation to the substrate.
Figure 2:
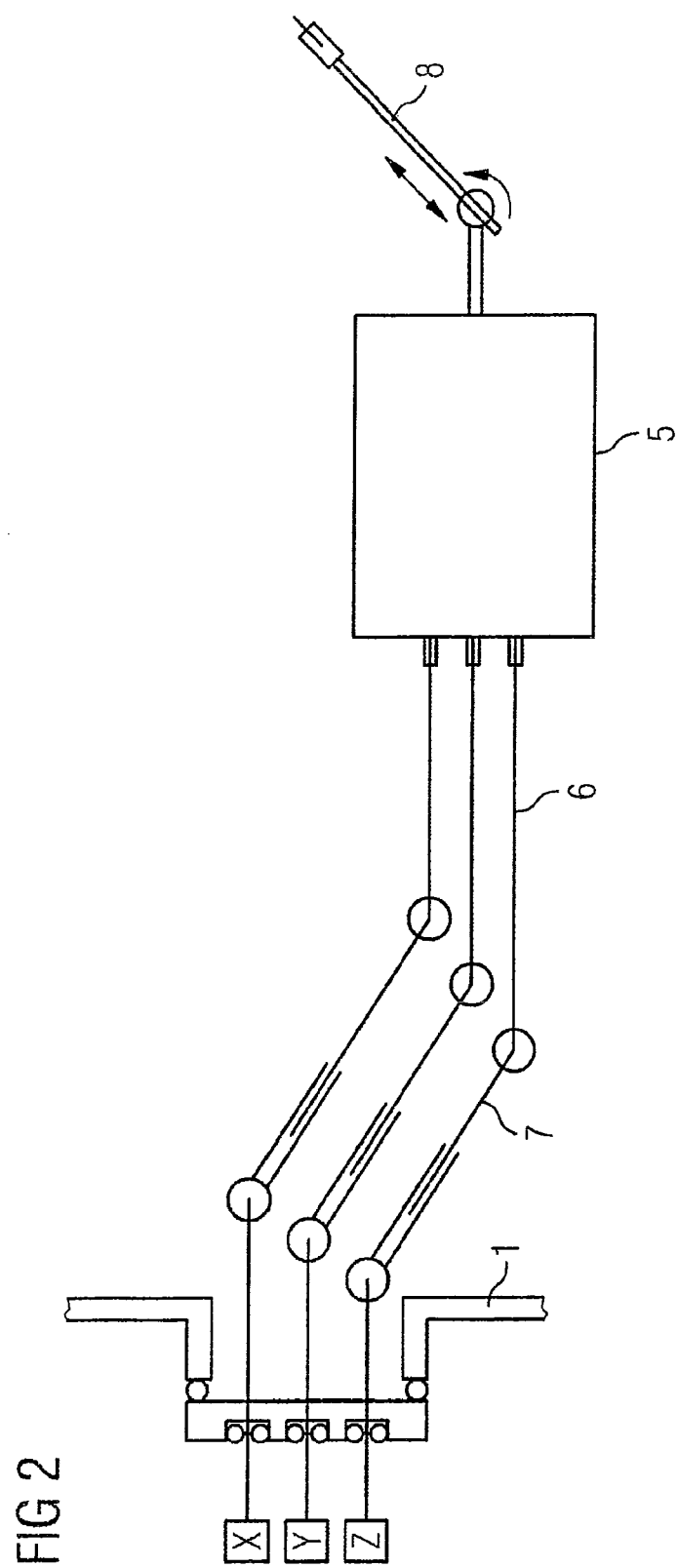
FIG. 2 shows a detail illustration of the mechanical displacement in interaction with the manipulator.

A fixed sample carrier 2 is situated inside a vacuum chamber 1. A probe holder plate 3 is situated above the sample carrier 2. Probe holders 4, which are provided with manipulators 5, may be laid and locked on this probe holder plate 3. As shown in FIGS. 1 through 4, displacement shafts 6, which have universal joints 7 and are guided through the vacuum chamber 1, are attached to the manipulators 5. Test probes 8 may thus be adjusted in relation to one another in such a way that they touch the contact surfaces (not shown) on the devices of the test substrate.

In FIG. 5, this setting is performed via motorized, in particular electro-motorized displaceable manipulators 5, so that a bushing through the wall of the vacuum chamber 1 may be dispensed with.

Figure 3:
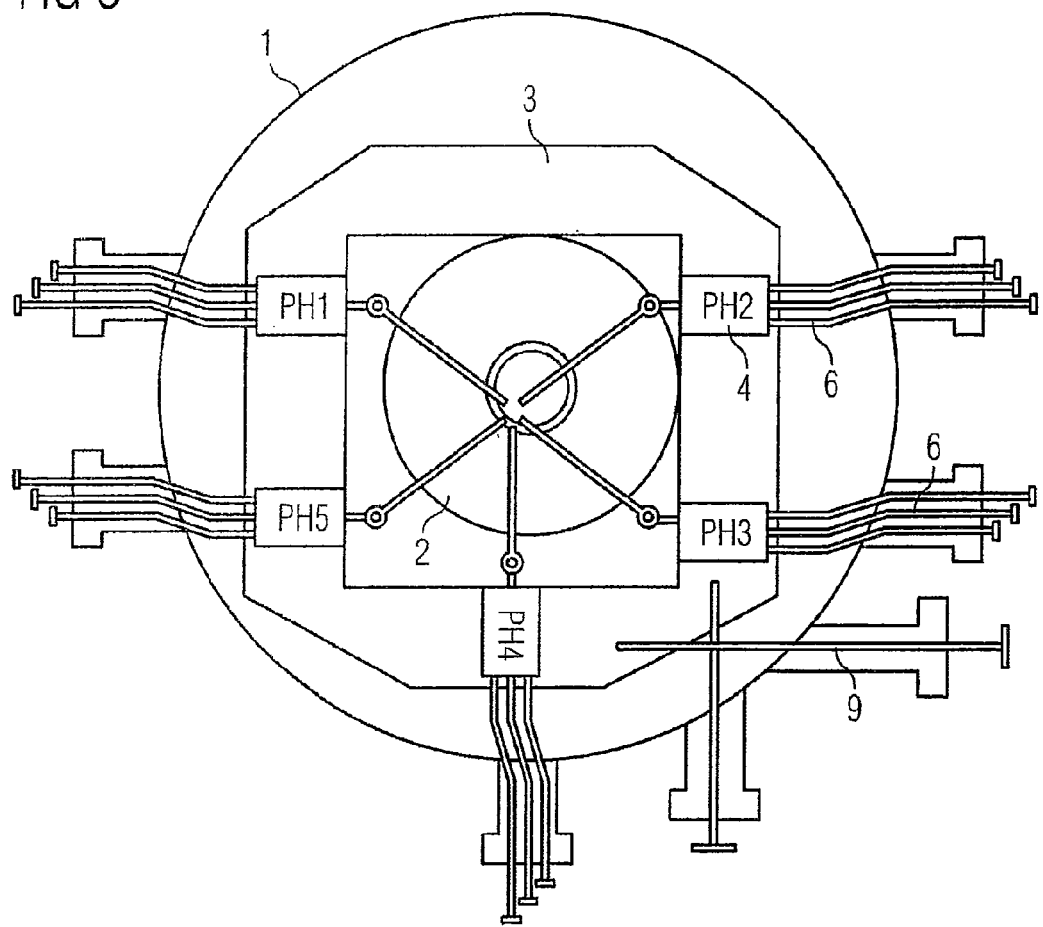
FIG. 3 shows the prober according to FIG. 1 in a first position shifted to the "southwest,"
Figure 4:
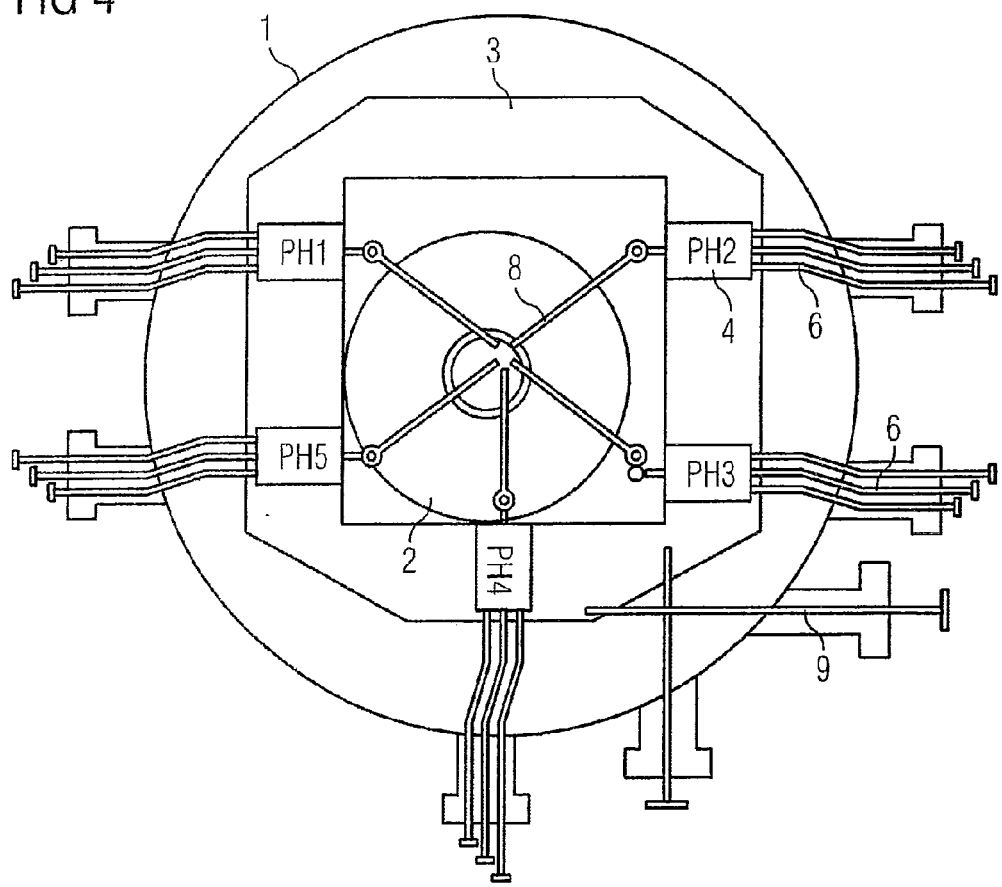
FIG. 4 shows the prober according to FIG. 1 in a first position shifted to the "northwest.

The probe holder plate 3 is displaceable in the X and Y directions, and with it also the probe holders 4, so that various devices may be reached via it, as is shown in FIG. 3 and FIG. 4. The movement may be achieved electrically or via rotary unions 9. The mobility is equalized via the universal joints 7, so that the adjustment shafts 6 may remain fixed in place.

All probe holders 4 are moved jointly by a movement of the probe holder plate 3, without the relations between the test probes 8 changing.

The invention claimed is:

1. A prober for testing devices in a repeat structure on a substrate, the prober comprising:
   a substrate carrier configured to retain the substrate;
   a plurality of probe holders, wherein each of the plurality of probe holders is configured to retain a test probe of a plurality of test probes, and further wherein each of the plurality of probe holders includes a manipulator configured to move the test probe of the plurality of test probes responsive to a motion of an adjustment shaft; and
   a probe holder plate, wherein each of the plurality of probe holders is operatively attached to the probe holder plate, wherein the probe holder plate is contained within a vacuum chamber, and further wherein the probe holder plate is configured to translate relative to the substrate without changing a relative orientation of the plurality of test probes with respect to one another.

2. The prober of claim 1, wherein the adjustment shaft includes a displacement shaft and corresponding universal joint that extends to an outside of the vacuum chamber, wherein the displacement shaft and corresponding universal joint are configured to control the motion of the adjustment shaft, and further wherein the displacement shaft and corresponding universal joint are configured to provide for translation of the probe holder plate relative to the vacuum chamber without changing a relative orientation of the plurality of test probes with respect to one another.

3. The prober of claim 1, wherein all of the plurality of test probes are configured to test a single device, and further wherein the probe holder plate is configured to translate from a first test position associated with testing of a first device to a second test position associated with testing of a second device without changing a relative orientation of the plurality of test probes with respect to one another.

4. The prober of claim 1, wherein the substrate carrier is configured to be stationary within the vacuum chamber during the testing.

5. The prober of claim 1, wherein the substrate includes a semiconductor wafer, and further wherein the devices include at least one of semiconductor chips and micromechanical devices.

6. The prober of claim 1, wherein the vacuum chamber is configured to produce a vacuum, and further wherein the probe holder plate is configured to translate in a first direction that is parallel to a surface of the substrate carrier and in a second direction that is parallel to the surface of the substrate carrier and perpendicular to the first direction while the probe holder plate is within the vacuum.

7. The prober of claim 6, wherein the probe holder plate is further configured to translate in a third direction that is perpendicular to the substrate carrier.

8. The prober of claim 1, wherein the prober further includes a motor configured to control the motion of the adjustment shaft.

9. The prober of claim 1, wherein the substrate is in thermal communication with a temperature control device configured to control a temperature of the substrate.

* * * * *